(12) United States Patent
Farooq et al.

(10) Patent No.: US 8,399,180 B2
(45) Date of Patent: Mar. 19, 2013

(54) THREE DIMENSIONAL INTEGRATION WITH THROUGH SILICON VIAS HAVING MULTIPLE DIAMETERS

(75) Inventors: Mukta G. Farooq, Hopewell Junction, NY (US); Ramona Kei, Miami, FL (US); Emily R. Kinser, Hopewell Junction, NY (US); Anthony D. Lisi, Hopewell Junction, NY (US); Richard Wise, Hopewell Junction, NY (US); Hakeem Yusuff, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/687,289

(22) Filed: Jan. 14, 2010

(65) Prior Publication Data

US 2011/0171582 A1 Jul. 14, 2011

(51) Int. Cl.
*G03F 7/26* (2006.01)
(52) U.S. Cl. ........................................ 430/312; 430/313
(58) Field of Classification Search .................. 430/311, 430/312, 314
See application file for complete search history.

(56) References Cited

U.S. PATENT DOCUMENTS

| | | | |
|---|---|---|---|
| 5,915,167 A | 6/1999 | Leedy | |
| 5,937,324 A | 8/1999 | Abercrombie et al. | |
| 6,133,640 A | 10/2000 | Leedy | |
| 6,208,545 B1 | 3/2001 | Leedy | |
| 6,500,755 B2 | 12/2002 | Dakshina-Murthy et al. | |
| 6,551,857 B2 | 4/2003 | Leedy | |
| 6,563,224 B2 | 5/2003 | Leedy | |
| 6,632,706 B1 | 10/2003 | Leedy | |
| 6,664,500 B2 | 12/2003 | Wilbur et al. | |
| 6,790,782 B1 | 9/2004 | Yang et al. | |
| 6,808,942 B1 | 10/2004 | Patel et al. | |
| 6,858,361 B2 | 2/2005 | Mui et al. | |
| 6,900,139 B1 | 5/2005 | Dakshina-Murthy et al. | |
| 6,924,088 B2 | 8/2005 | Mui et al. | |
| 6,949,830 B2 | 9/2005 | Owada et al. | |
| 6,953,722 B2 | 10/2005 | Seidl et al. | |
| 7,041,434 B2 | 5/2006 | Raebiger et al. | |
| 7,081,408 B2 | 7/2006 | Lane et al. | |
| 7,132,340 B2 | 11/2006 | Sadra et al. | |
| 7,138,295 B2 | 11/2006 | Leedy | |

(Continued)

FOREIGN PATENT DOCUMENTS

| CN | 1268925 A | 10/2000 |
|---|---|---|
| CN | 1525485 A | 9/2004 |

(Continued)

OTHER PUBLICATIONS

English Abstract of JP2009032992(A) data supplied from the esp@cenet database Worldwide.

*Primary Examiner* — Kathleen Duda
(74) *Attorney, Agent, or Firm* — Cantor Colburn LLP; Katherine Brown

(57) ABSTRACT

A method is disclosed which includes patterning a photoresist layer on a substrate of a structure, removing a first portion of the photoresist layer to expose a first area of the substrate, etching the first area to form a cavity having a first depth, removing a second portion of the photoresist to expose an additional area of the substrate, and etching the cavity to expose a first conductor in the structure and the additional area to expose a second conductor in the structure.

11 Claims, 11 Drawing Sheets

U.S. PATENT DOCUMENTS

| | | |
|---|---|---|
| 7,151,055 B2 | 12/2006 | Aminpur et al. |
| 7,176,126 B2 | 2/2007 | Oh et al. |
| 7,193,239 B2 | 3/2007 | Leedy |
| 7,320,927 B2 | 1/2008 | DeLoach et al. |
| 7,402,515 B2 | 7/2008 | Arana et al. |
| 7,453,150 B1 | 11/2008 | McDonald |
| 7,474,004 B2 | 1/2009 | Leedy |
| 7,504,732 B2 | 3/2009 | Leedy |
| 7,538,032 B2 | 5/2009 | Borwick et al. |
| 7,705,466 B2 | 4/2010 | Leedy |
| 2002/0132465 A1 | 9/2002 | Leedy |
| 2003/0173608 A1 | 9/2003 | Leedy |
| 2007/0042599 A1 | 2/2007 | Tsui et al. |
| 2007/0045779 A1 | 3/2007 | Hiatt |
| 2007/0096312 A1 | 5/2007 | Humpston et al. |
| 2007/0138562 A1 | 6/2007 | Trezza |
| 2007/0182014 A1 | 8/2007 | Usami et al. |
| 2008/0153187 A1 | 6/2008 | Luo et al. |
| 2009/0014843 A1 | 1/2009 | Kawashita et al. |
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2011/0076845 A1* | 3/2011 | Tsai et al. ..................... 438/618 |

FOREIGN PATENT DOCUMENTS

| | | |
|---|---|---|
| CN | 101188235 A | 5/2008 |
| EP | 0975472 A1 | 2/2000 |
| EP | 1986233 A2 | 10/2008 |
| JP | 2008028407 A | 2/2008 |
| JP | 200516033 A | 5/2008 |
| JP | 2008166831 a | 7/2008 |
| JP | 2008166832 A | 7/2008 |
| JP | 2008172254 A | 7/2008 |
| JP | 2009032992 A | 2/2009 |
| KR | 1020010005983 A | 1/2001 |
| KR | 1020050107819 A | 11/2005 |
| TW | 412854 | 11/2000 |

* cited by examiner

THREE DIMENSIONAL INTEGRATION WITH THROUGH SILICON VIAS HAVING MULTIPLE DIAMETERS

BACKGROUND

The present invention relates to semiconductor device manufacturing techniques, specifically fabrication of through silicon vias (TSVs) with multiple diameters.

In the microelectronics industry, packaging density continuously increases in order to accommodate more electronic devices into a package. In this regard, three-dimensional (3D) stacking technology of wafers and/or chips substantially contributes to the device integration process. Typically, a semiconductor wafer includes several layers of integrated circuitry (e.g., processors, programmable devices, memory devices, etc.) built on a silicon substrate. A wafer may be cut into a number of portions to define chips. A top layer of such a chip may be connected to a bottom layer of another such chip by means of through silicon interconnects or vias. In order to form a 3D integrated circuit (IC) stack, two or more chips or wafers are placed on top of one other and bonded.

Previous methods for electrically connecting the stacked chips or wafers used vias that consumed geometric space on the 3D IC by connecting multiple vias of a single diameter utilizing additional wiring levels. The formation of TSVs with complex shapes, such as multiple diameters in a single TSV, has used inefficient fabrication methods utilizing additional mask layers and patterning steps, which adds cost, complexity, and process time to the manufacturing process.

3D wafer stacking technology offers a number of potential benefits, including, for example, improved form factors, lower costs, enhanced performance, and greater integration through system-on-chip (SOC) solutions. In addition, the 3D wafer stacking technology may provide other functionality to the chip. For instance, after being formed, the 3D wafer stack may be diced into stacked dies or chips, with each stacked chip having multiple tiers (i.e., layers) of integrated circuitry. SOC architectures formed by 3D wafer stacking can enable high bandwidth connectivity of products such as, for example, logic circuitry and dynamic random access memory (DRAM), that otherwise have incompatible process flows. At present, there are many applications for 3D wafer stacking technology, including high performance processing devices, video and graphics processors, high density and high bandwidth memory chips, and other SOC solutions.

BRIEF SUMMARY

According to one embodiment of the present invention, a method includes patterning a photoresist layer on a substrate of a structure, removing a first portion of the photoresist layer to expose a first area of the substrate, etching the first area to form a cavity having a first depth, removing a second portion of the photoresist to expose an additional area of the substrate, and etching the cavity to expose a first conductor in the structure and the additional area to expose a second conductor in the structure.

An alternate exemplary method includes patterning a photoresist layer on a substrate of a structure, the photoresist layer defining an opening having a first area, etching to form a cavity having a first depth in the structure partially defined by the first area, depositing a spacer material along sidewalls of the cavity to define an opening having a second area, and etching to increase the depth of a portion of the cavity in the structure to expose a first conductor and a second conductor in the structure.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The drawings are not necessarily drawn to scale. The forgoing and other features, and advantages of the invention are apparent from the following detailed description taken in conjunction with the accompanying drawings in which:

DETAILED DESCRIPTION

Figure 1:
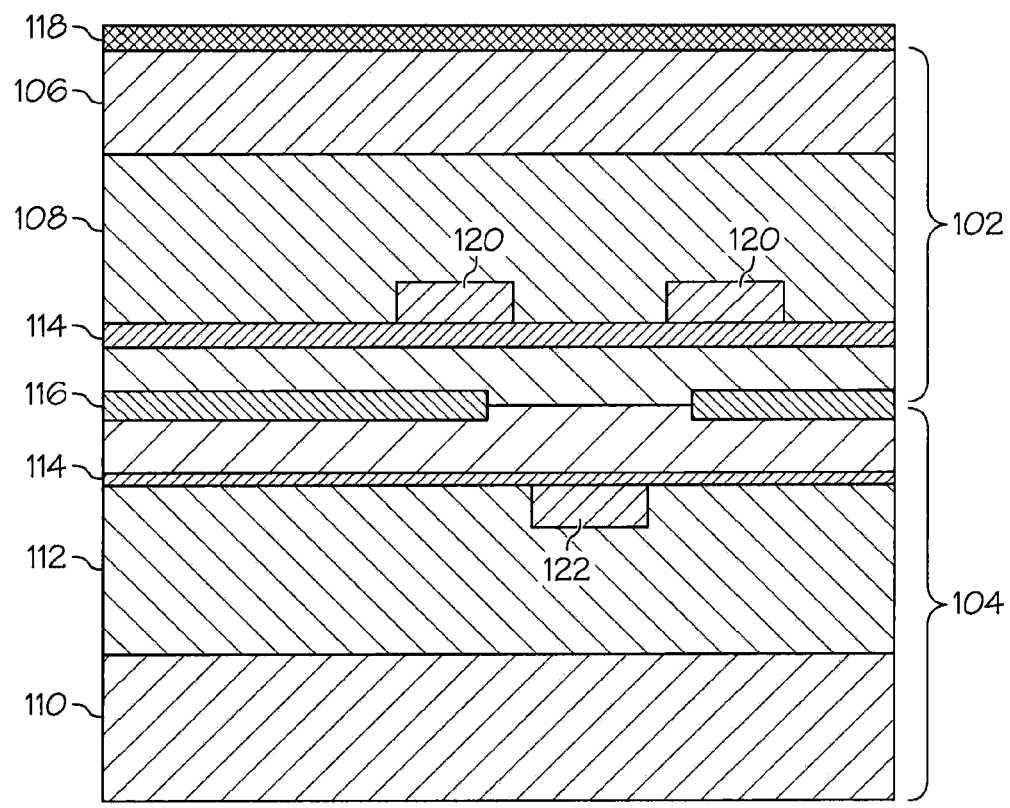
FIG. 1 illustrates a cross-sectional view of an exemplary embodiment of an integrated circuit (IC).

FIG. 1 illustrates a cross sectional view of an exemplary embodiment of a portion of a three-dimensionally integrated circuit (3D IC) including multiple bonded silicon substrates having a first component 102 arranged on a second component 104. The first component 102 and second component 104 may each be, for example, a silicon wafer or chip, in which the wafer or chip includes front-end-of-line (FEOL), middle-of-line (MOL), and back-end-of-line (BEOL) structures formed thereon, as known in the art. The first component 102 includes a substrate portion 106, which may be a silicon substrate, and a wiring level portion 108, which may comprise a conductive line embedded in a dielectric layer. The substrate portions 106 and 110 consist of a semiconductor material, which may be a single crystalline substrate which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The second component 104 includes a substrate portion 110, which may be a silicon wafer, and a wiring level portion 112, which may include a conductive line embedded in a dielectric layer. For illustrative purposes, one wiring layer per bonded wafer component is shown, however multiple wiring layers may be included in alternate embodiments. Cap layers 114, for example, nitride material such as silicon nitride, may be arranged on the top surfaces of wiring level portions 108 and 112. For illustrative purposes, only one capping layer per wiring level is depicted, although it is understood to those practicing in the art that additional capping layers may be dispersed throughout the bonded three-dimensional IC structure. The first component 102 and the second component 104 are in contact and may be bonded by a bonding material 116 such as, for example, an adhesive or a metallic layer such as, for example copper, or bonded with an oxide-oxide process, or other bonding process known in the art. Alternate orientations of the IC structure may include, for example back-to-face bonding wherein an exposed top surface of a wiring level of a wafer is bonded to a silicon portion of another silicon substrate. The arrangement may include an oxide or hardmask layer 118 deposited on the exposed top surface of substrate portion 106. Hardmask layer 118 may be an oxide film, doped oxide film, or other material known in the art. The substrate portion 106 may be relatively thinner than the substrate portion 110 of the second component 104. The first component 102 includes a conductive contact 120, and the second component 104 includes a conductive contact 122, where both conductive contacts are fabricated prior to the bonding of component 102 and component 104. Though the illustrated embodiments include a 3D IC including a structure having two bonded silicon substrate components, alternate embodiments may include any number of bonded substrate components.

Figure 2A:
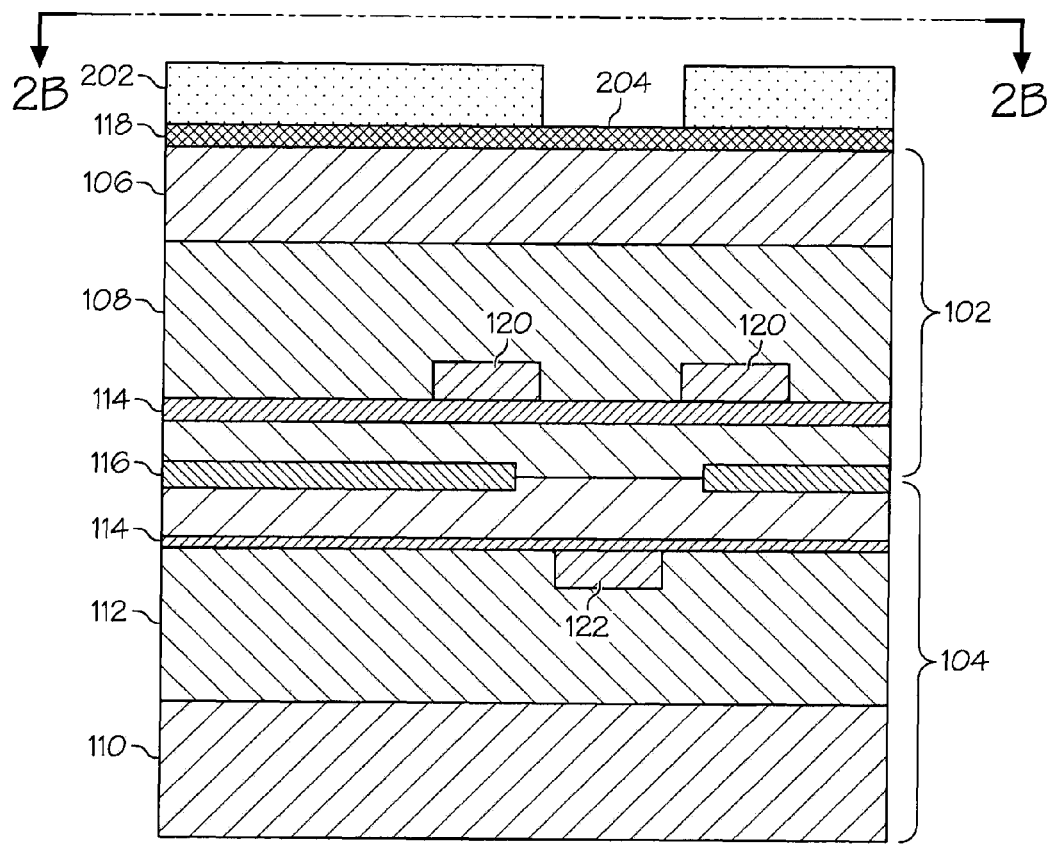
FIGS. 2A-6 illustrate exemplary methods for forming a TSV with multiple diameters in the structures of FIG. 1.
Figure 2B:
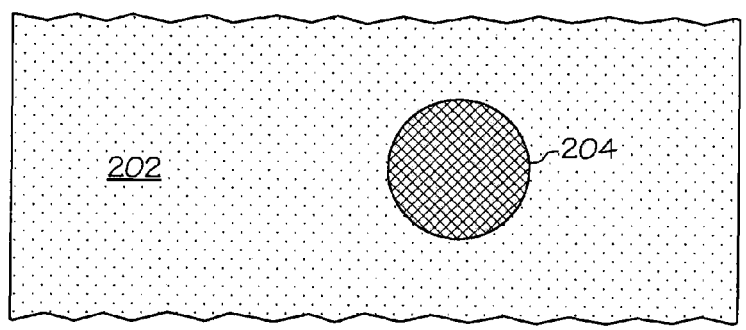

The FIGS. 2A-6 illustrate exemplary methods for forming a TSV in the 3D IC structure described above. In this regard, FIG. 2A illustrates a photoresist layer 202 deposited on the hardmask layer 118. The photoresist layer 202 is patterned to define an opening 204 that exposes a first planar area of the hardmask layer 118. Though the illustrated embodiment includes the hardmask layer 118, other embodiments may deposit the photoresist layer 202 on the silicon substrate portion 106. The opening 204 may be any suitable geometric shape such as, for example, a circular, rectangular or an irregular shape. FIG. 2B illustrates a top view along the line 2B-2B (of FIG. 2A) of a portion of the photoresist layer 202 and the opening 204.

Figure 3:
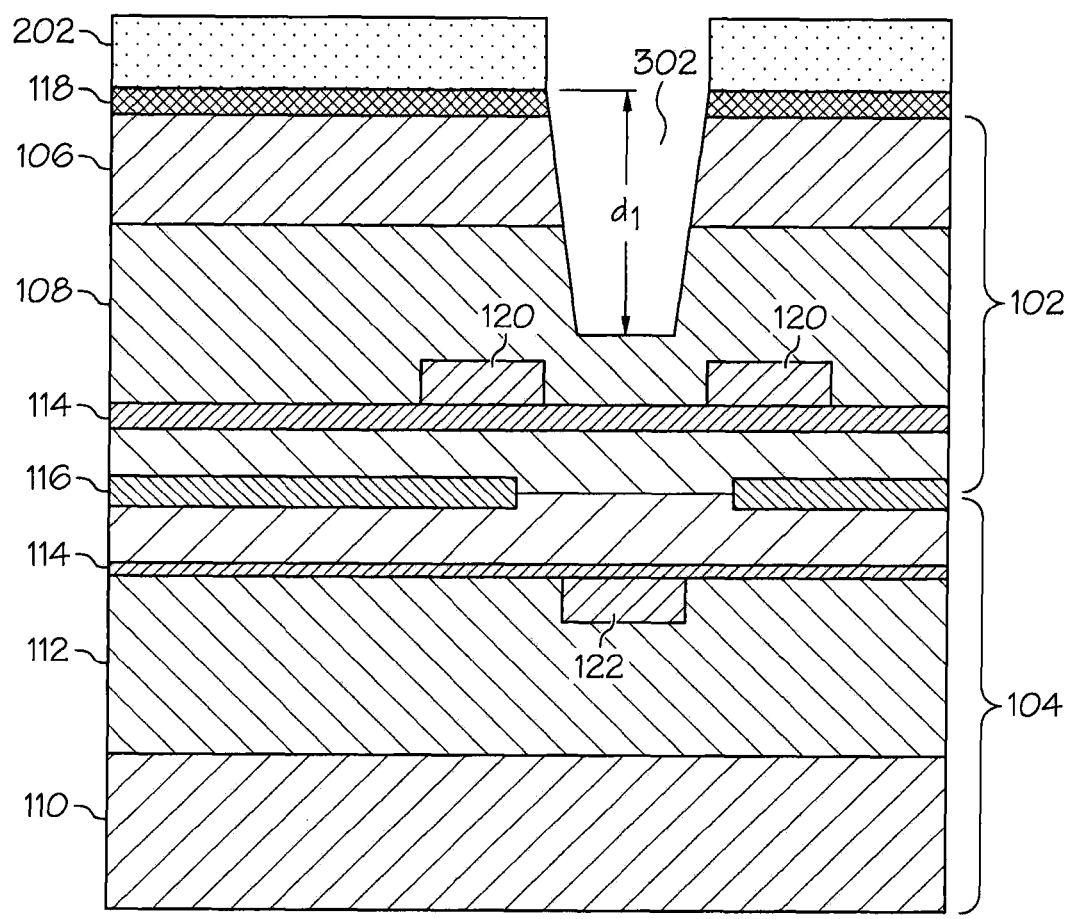

FIG. 3 illustrates a TSV cavity 302 that is etched to a first depth (d1). The TSV cavity 302 may be etched using any suitable known etching process such as, for example, a reactive ion etching (RIE) process. In the illustrated embodiment, the etching process is timed to form the TSV cavity 302 having the desired first depth (d1). The first depth (d1) may be determined by the thickness of the first component 102, the second component 104, the locations of the conductive contacts, and the anisotropy of the etch process.

Figure 4A:
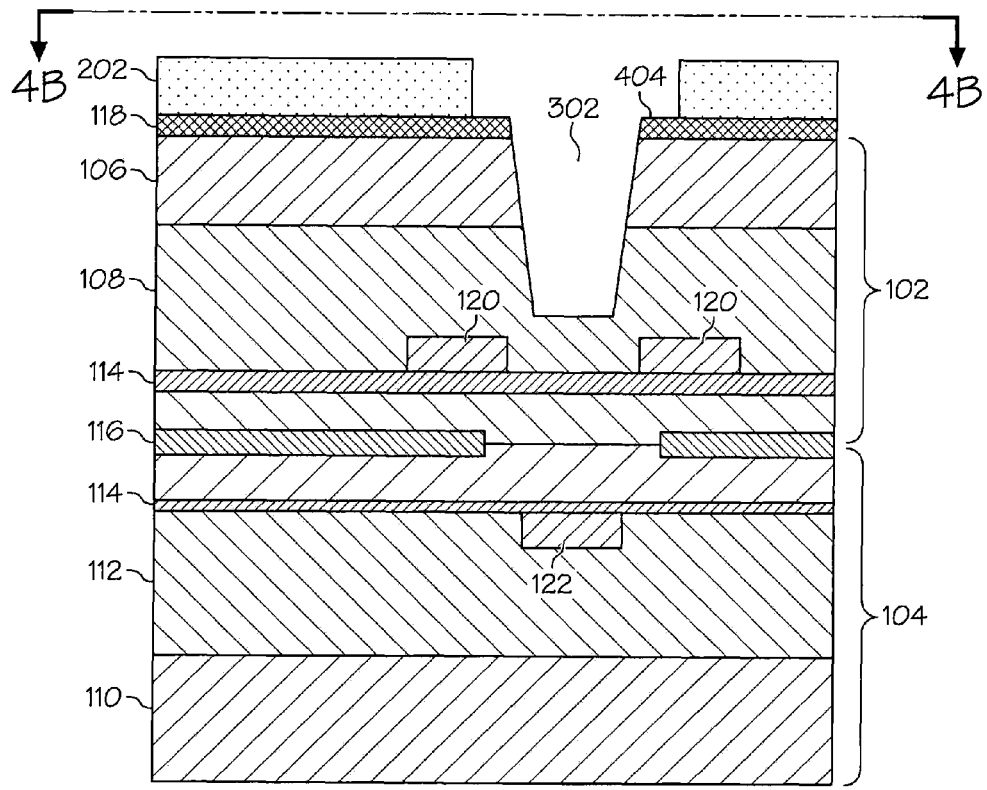
Figure 4B:
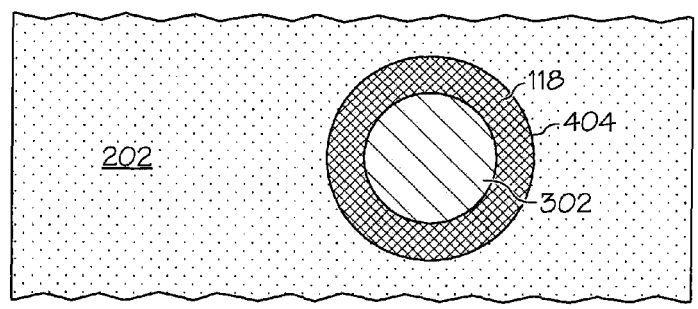

FIG. 4A illustrates an opening 404 that is defined by the photoresist layer 202. The opening exposes a second planar area of the hardmask layer 118 that was previously covered by photoresist layer 202. The opening 404 is formed by an in-situ removal of a portion of the photoresist layer 202 by, for example, an $O_2$ flash process that increases the size of the opening 204 (of FIG. 2A), where the term in-situ refers to the operation occurring in the same process tool or chamber as the initial etch operation without breaking vacuum. In the illustrated embodiment, the $O_2$ flash process also reduces the thickness of the photoresist layer 202. The opening can also be similarly increased in-situ by using other gases known in the art, including $CO_2$, $CO$, $N_2/H_2$, and any combination of all of these gases in optimized flow ratios. In this case, the preferred embodiment of etch process tool would utilize decoupled plasma, ie the tool is required to be capable of operating with minimal or no applied RF bias to the wafer. Furthermore, other etch processing conditions and parameters that enhance lateral etch may be manipulated in-situ to attain a desired opening size. FIG. 4B illustrates a top view along the line 4B-4B (of FIG. 4A) of a portion of the photoresist layer 202 and the opening 404.

Figure 5:
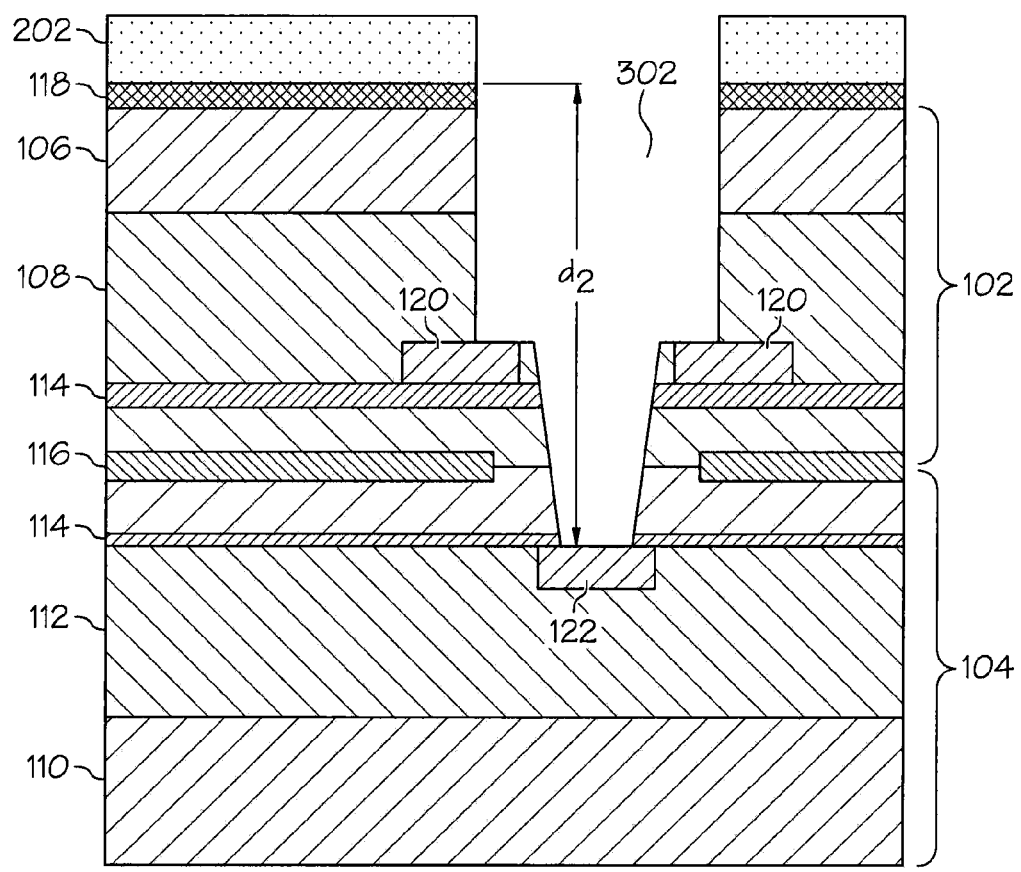

FIG. 5 illustrates the resultant TSV cavity 302 following an etching process that increases the depth of the cavity (d2) and exposes the contact 122 in the second component 104. The etching process expands cavity 302 as defined by the opening 404 and to exposes the contact 120 in the first component 102. The etching process may be for example, a RIE process that may be timed to effect the desired depths, or the etch may reach the desired depths utilizing endpoint detection methodology when the contacts 120 and 122 are exposed.

Figure 6:
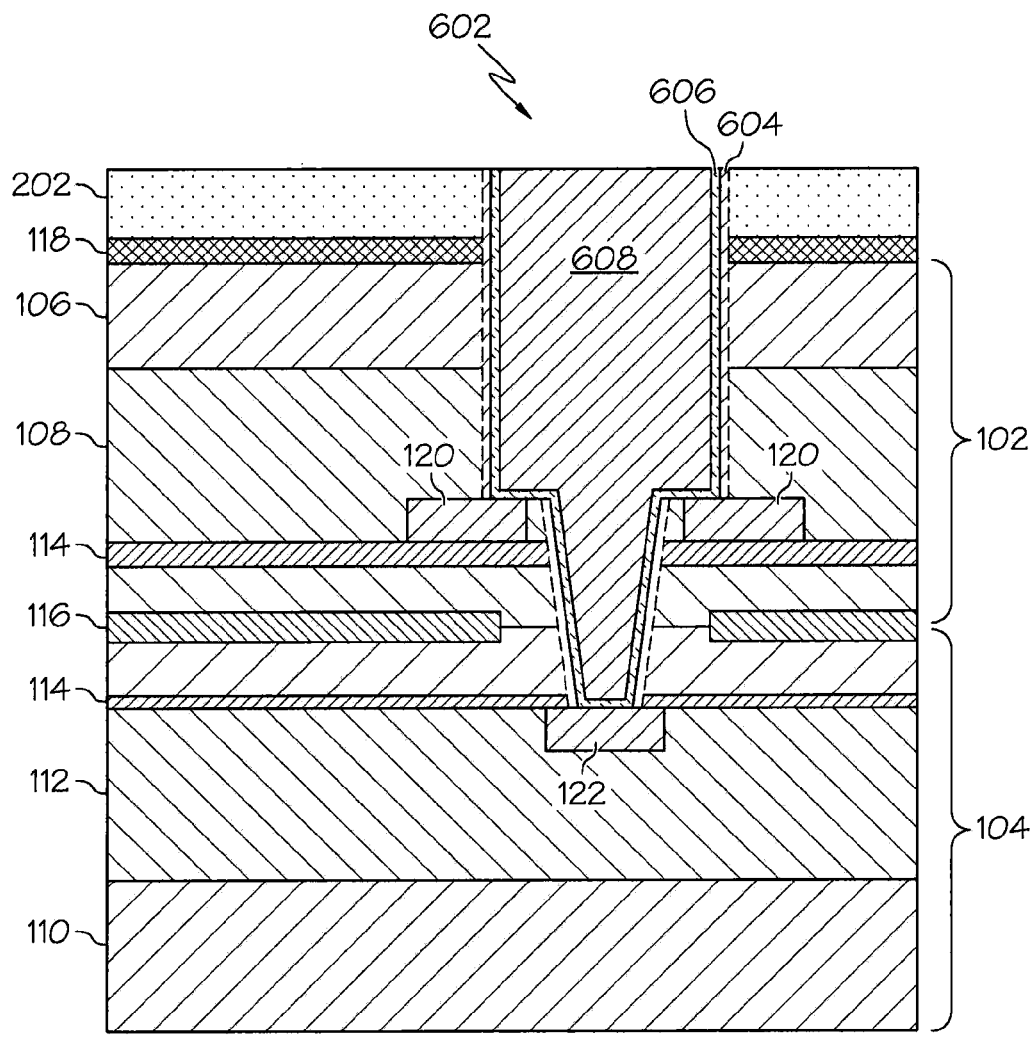

FIG. 6 illustrates a resultant through silicon via 602. The photoresist layer 202 (of FIG. 5) may be removed, and if desired, the hardmask layer 118 may also be removed, and a cleaning operation may be performed. A dielectric isolation region 604 may be formed in the TSV cavity 302, and a portion of the dielectric isolation layer removed to expose portions of the contacts. A barrier/seed layer 606 may be deposited in the TSV cavity 302, and a conductive material 608 such as, for example copper or tungsten, deposited in the TSV cavity 302 and then planarized using, for example, a chemical mechanical planarization operation, to form the through silicon via 602.

Figure 7A:
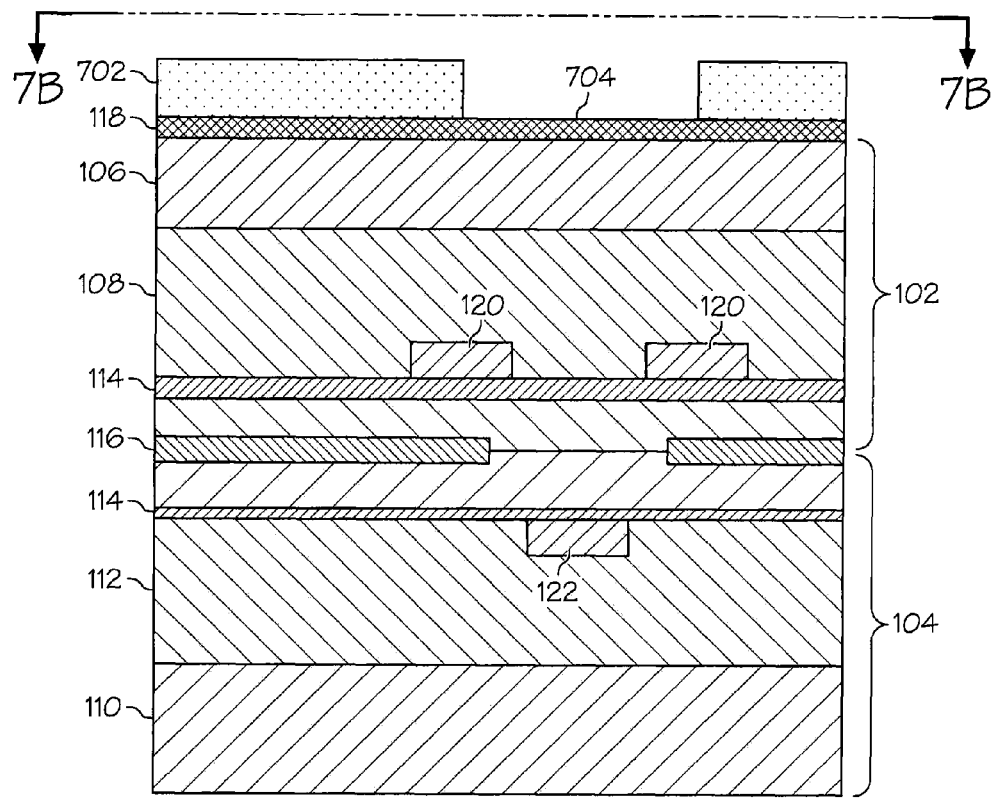
FIGS. 7A-11 illustrate an alternate exemplary method for forming a TSV in the IC structures of FIG. 1.
Figure 7B:
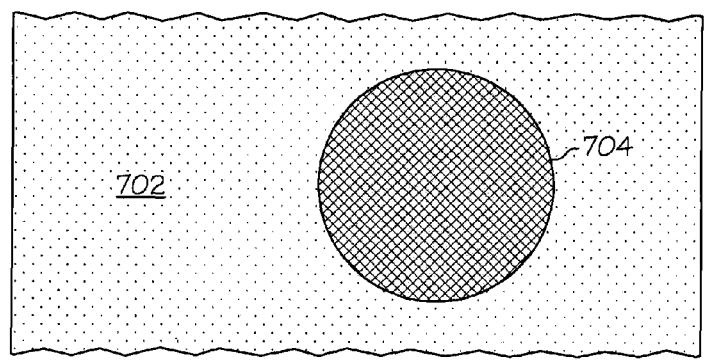

FIGS. 7A-11 illustrate an alternate exemplary method for forming a through silicon via in a 3D IC structure. In this regard, FIG. 7A illustrates a photoresist layer 702 deposited on the hardmask layer 118. The photoresist layer 702 is patterned to define an opening 704 that exposes a first planar area of the hardmask layer 118. FIG. 7B illustrates a top view along the line 7B-7B (of FIG. 7A) of a portion of the photoresist layer 702 and the opening 704.

Figure 8:
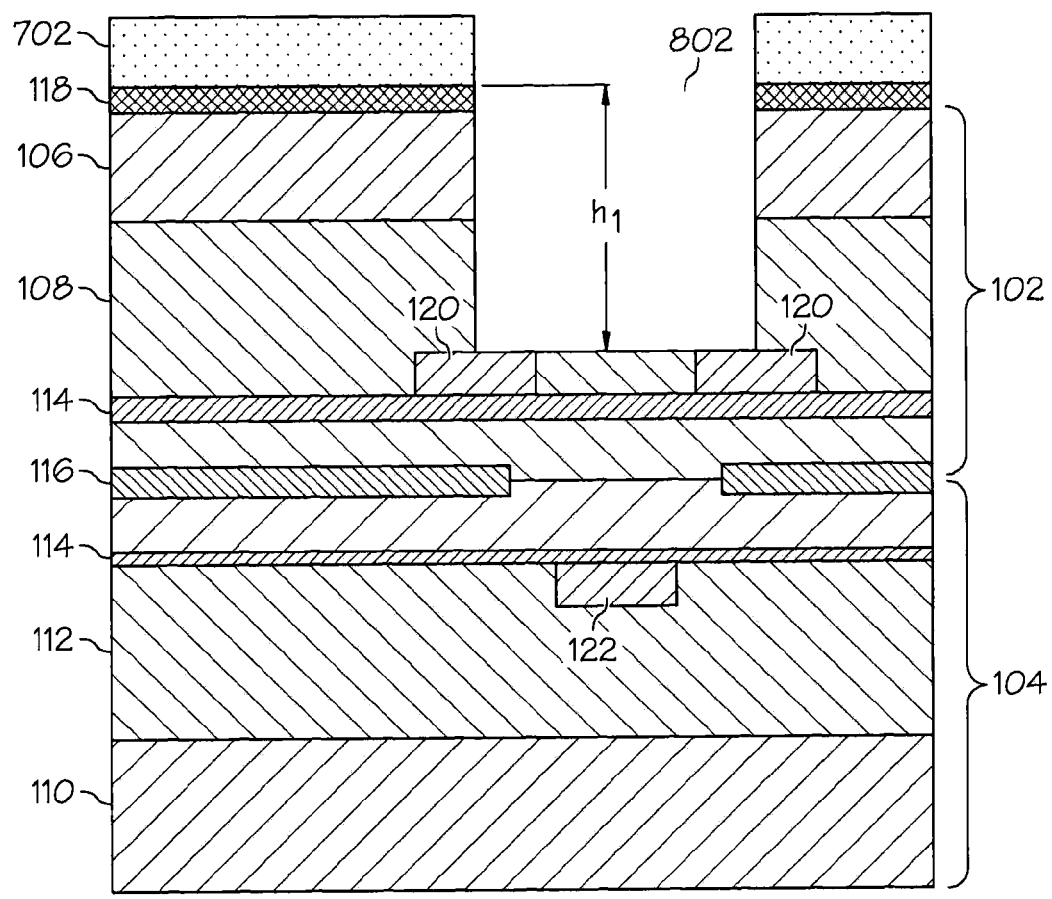

FIG. 8 illustrates a TSV cavity 802 etched to a first depth (h1). The TSV cavity 802 may be etched using any suitable etching process such as, for example, a reactive ion etching (RIE) process. In the illustrated embodiment, the etching process is timed to form the cavity 802 having the desired first depth (h1). Desired first depth h1 may equal a depth that exposes the contact 120, in which case endpoint detection methodology may be utilized.

Figure 9A:
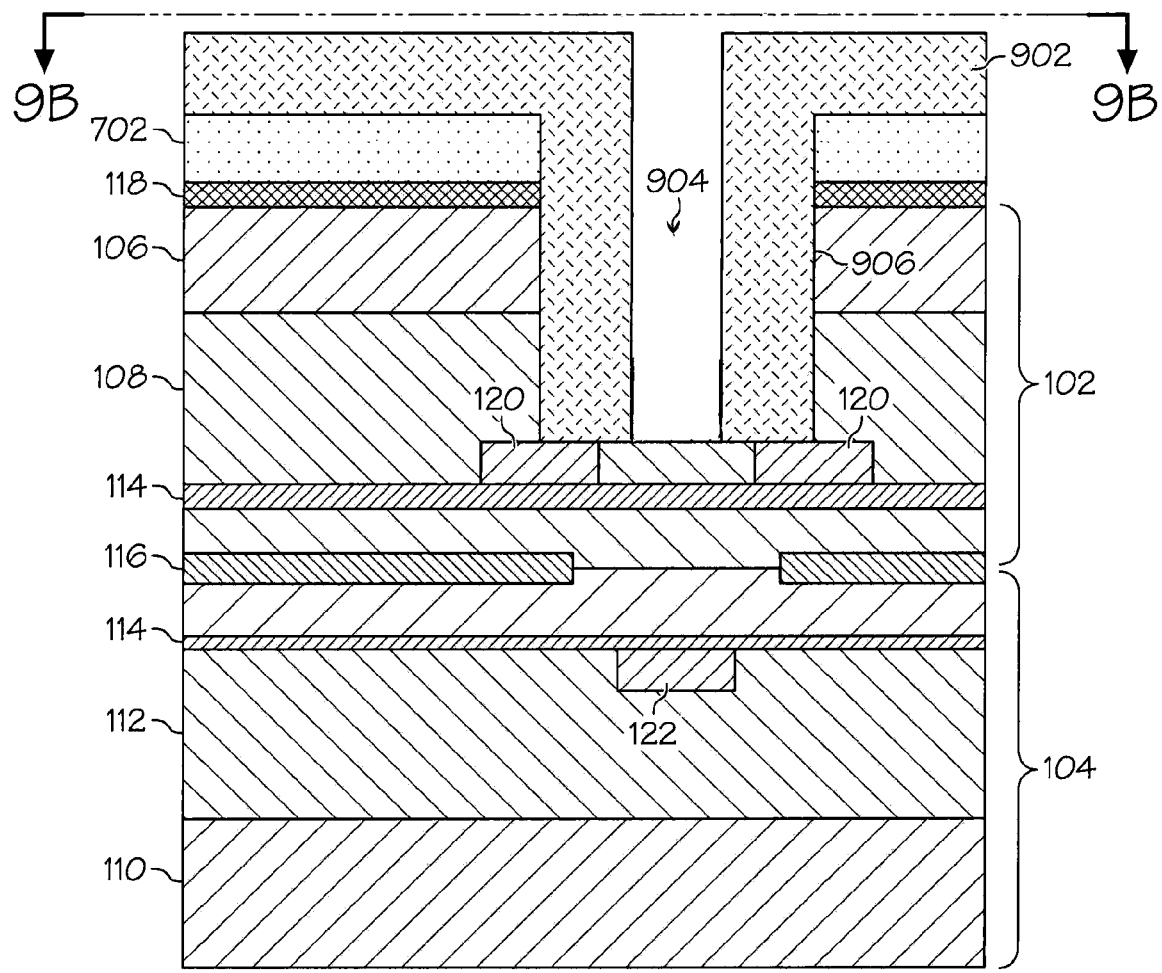
Figure 9B:
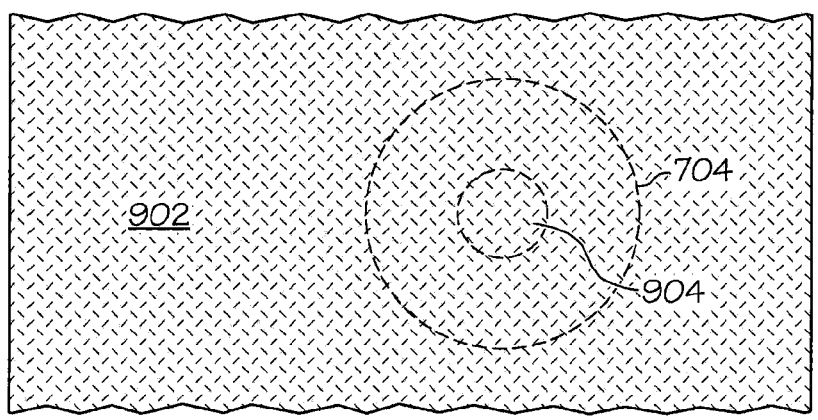

FIG. 9A illustrates a spacer 902 deposited in-situ, meaning in the same plasma etch tool utilized in the prior etch operations, that defines an exposed second planar area 904. The spacer 902 lines the sidewalls 906 of the TSV cavity 802. The spacer 902 may be, for example, an etch polymer material or another suitable spacer material. In the illustrated embodiment, spacer 902 is generated from hydro-fluorocarbon feedstock. Reactant gases that can be employed to form the spacer include, but are not limited to, $C_xF_y$, $C_xH_yF_z$, $SF_6$, $C_2H_4$, $N_2/H_2$, and $CH_4$, combined with carrier gases such as He, Ar, and $N_2$, and exposed to reactive plasma. FIG. 9B illustrates a top view along the line 9B-9B (of FIG. 9A) of a portion of the photoresist layer 702 and the second planar area 904.

Figure 10:
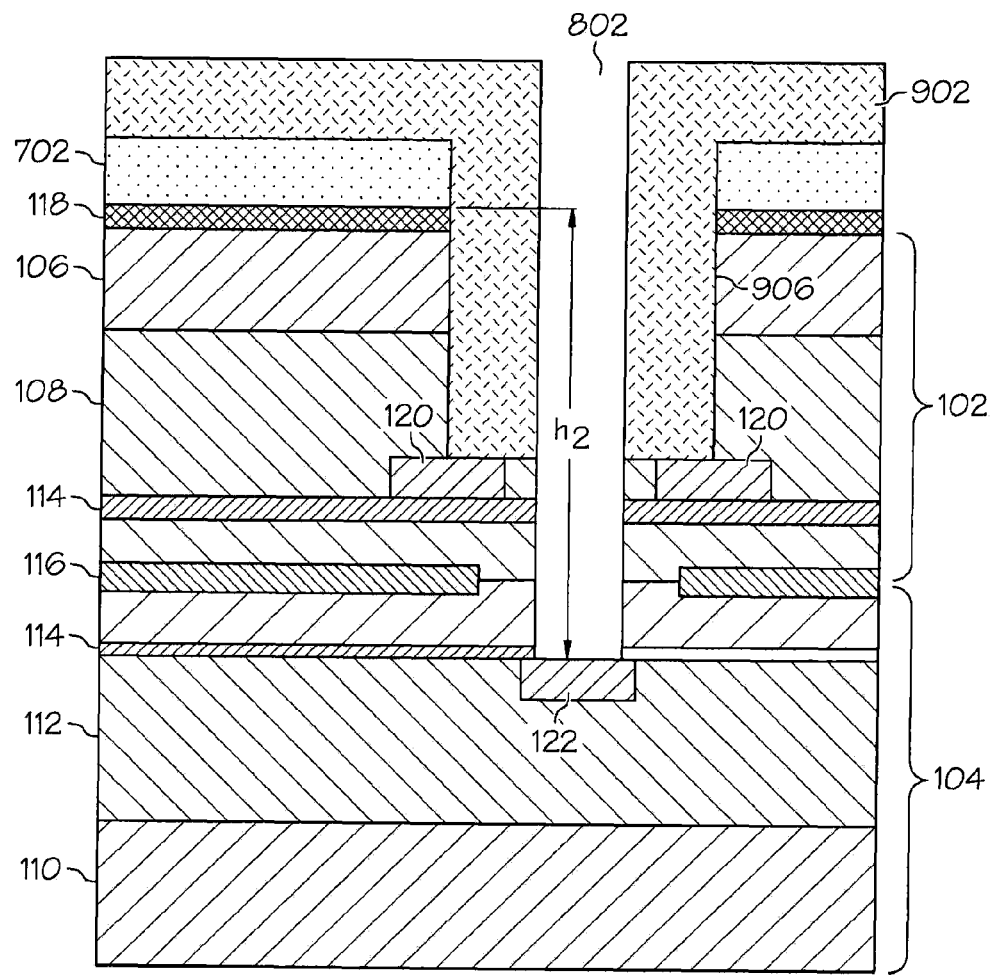

FIG. 10 illustrates the resultant TSV cavity 802 following an etching process that increases the depth (h2) of the TSV cavity 802, and exposes the contact 122 in the second component 104.

Figure 11:
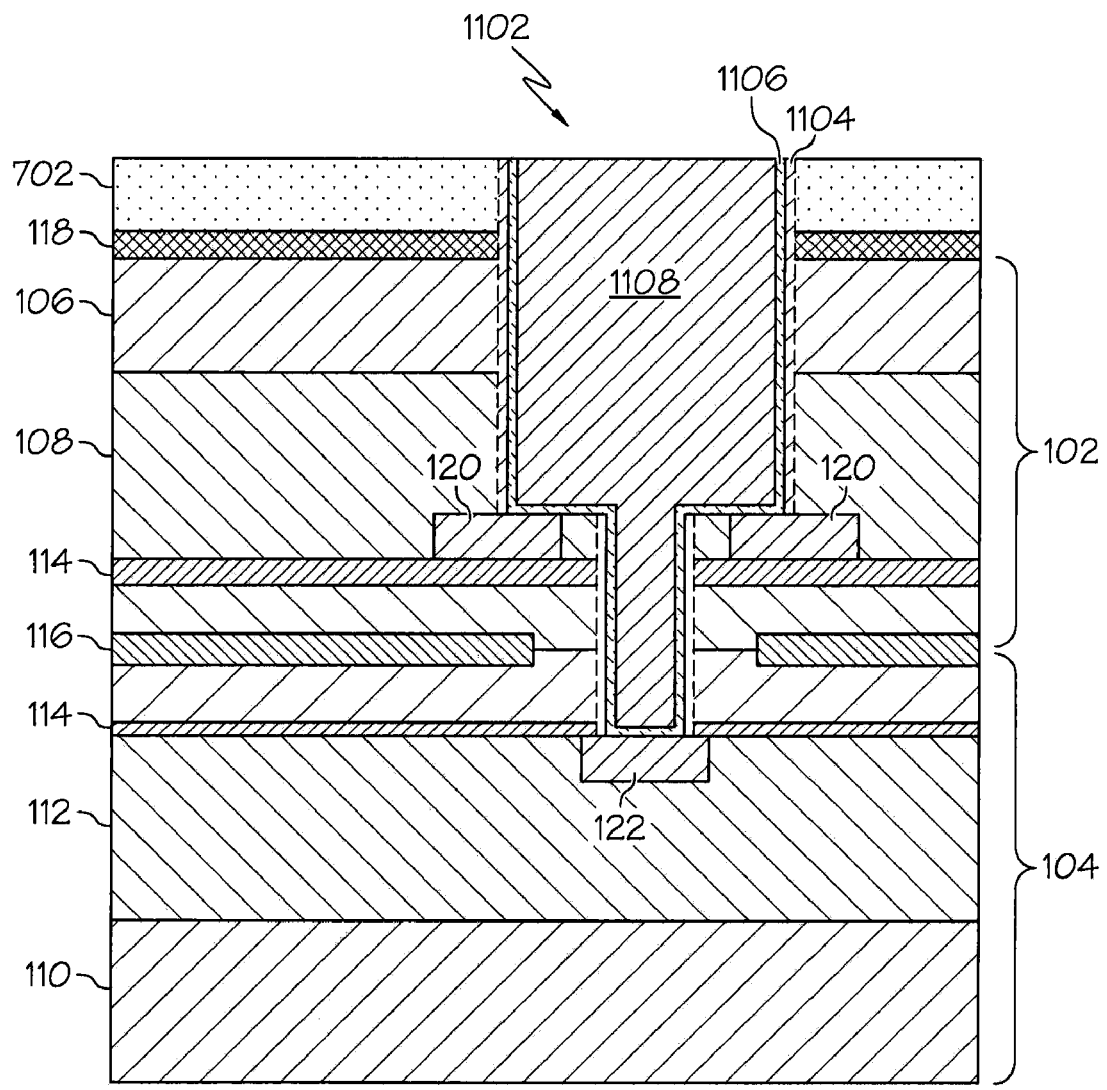

FIG. 11 illustrates a resultant via 1102, formed after spacer 902 is removed. The photoresist layer 702 (of FIG. 10) may be removed. A dielectric isolation region 1104 may be formed, and a portion of the dielectric isolation layer may be etched to expose portions of the contacts. A barrier/seed layer 1106 may be deposited in the TSV cavity 802, and conductive material 1108 such as, for example copper or tungsten, deposited in the TSV cavity 802, and then planarized using, for example, a chemical mechanical planarization operation, to form the through silicon via 1102.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The description is presented for purposes of illustration, but is not intended to be exhaustive or to limit the invention in the form disclosed. Many modifications and variations will be apparent to those of ordinary skill in the art without departing from the scope and spirit of the invention.

The diagrams depicted herein are just examples. There may be many variations to the structure or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
   patterning a photoresist layer on a substrate of a structure having at least one conductor embedded therein;
   removing a first portion of the photoresist layer to expose a first area of the substrate;
   etching the first area to form a cavity having a first depth;
   removing a second portion of the photoresist to expose an additional area of the substrate; and
   etching the cavity to expose a first conductor in the structure and the additional area to expose a second conductor in the structure.

2. The method of claim 1, wherein the structure includes a first wafer component arranged on a second wafer component.

3. The method of claim 2, wherein first wafer component has a substrate portion and a wiring level portion arranged on a wiring level portion of second wafer component.

4. The method of claim 3, wherein the wiring level portion of the first wafer component and the wiring level portion of the second wafer component are bonded together with an adhesive.

5. The method of claim 3, wherein the wiring level portion of the first wafer component and the wiring level portion of the second wafer component are bonded together with a metal.

6. The method of claim 1, wherein the structure includes a first chip component arranged on a second chip component.

7. The method of claim 1, wherein the substrate includes a silicon material.

8. The method of claim 1, wherein the removal of the second portion of the photoresist layer to expose an additional area of the substrate is performed in-situ.

9. The method of claim 1, wherein the photoresist layer is patterned on an exposed silicon surface of the structure.

10. The method of claim 1, wherein after etching the cavity to expose a first conductor in the structure and the additional area to expose a second conductor in the structure the method further comprises:
    forming a dielectric layer in the cavity;
    removing a portion of the dielectric layer;
    depositing a barrier layer on the dielectric;
    filling the cavity with a conductive material; and
    removing the excess conductive material by planarization.

11. The method of claim 10, wherein the conductive material is operative to electrically connect the first conductor and the second conductor.

* * * * *